(12) United States Patent
Yang et al.

(10) Patent No.: US 11,534,794 B2
(45) Date of Patent: Dec. 27, 2022

(54) CRUCIBLE STRUCTURE AND METHOD FOR FORMING ISOLATING LAYER OF CRUCIBLE

(71) Applicant: Sino-American Silicon Products Inc., Hsinchu (TW)

(72) Inventors: Yu-Min Yang, Hsinchu (TW);
Huang-Wei Lin, Hsinchu (TW);
Bo-Kai Wang, Hsinchu (TW);
Sung-Lin Hsu, Hsinchu (TW);
Ying-Ru Shih, Hsinchu (TW)

(73) Assignee: Sino-American Silicon Products Inc., Hsinchu (TW)

( * ) Notice: Subject to any disclaimer, the term of this patent is extended or adjusted under 35 U.S.C. 154(b) by 351 days.

(21) Appl. No.: 16/882,553

(22) Filed: May 25, 2020

(65) Prior Publication Data

US 2020/0398304 A1 Dec. 24, 2020

(30) Foreign Application Priority Data

Jun. 24, 2019 (TW) .................................. 108121897

(51) Int. Cl.
*B05D 1/02* (2006.01)
*C09D 1/00* (2006.01)
*C01B 33/021* (2006.01)
*C01B 21/068* (2006.01)
*C09D 5/18* (2006.01)
*C04B 41/00* (2006.01)
*C04B 41/45* (2006.01)
(Continued)

(52) U.S. Cl.
CPC .............. *B05D 1/02* (2013.01); *C01B 21/068* (2013.01); *C01B 33/021* (2013.01); *C04B 41/009* (2013.01); *C04B 41/4543* (2013.01); *C04B 41/87* (2013.01); *C09D 1/00* (2013.01); *C09D 5/18* (2013.01); *C30B 35/002* (2013.01)

(58) Field of Classification Search
CPC ....................................................... B05D 1/02
See application file for complete search history.

(56) References Cited

U.S. PATENT DOCUMENTS

2015/0259820 A1* 9/2015 Chou ..................... B05D 7/227
118/712

FOREIGN PATENT DOCUMENTS

| CN | 101433890 | * | 5/2009 |
| CN | 202185374 | | 4/2012 |
| CN | 102992639 | | 3/2013 |

(Continued)

*Primary Examiner* — Nathan T Leong
(74) *Attorney, Agent, or Firm* — JCIPRNET

(57) ABSTRACT

A method for forming an isolating layer of a crucible includes placing a round crucible sideways with a bottom surface of an inside thereof perpendicular to a horizontal plane, and then performing a plurality of spraying processes to form the isolating layer on the bottom surface and a wall surface of the round crucible. Each spraying process includes spraying a slurry on the bottom surface; using an optical positioner to set a spraying range the same as one of a plurality of partial areas divided from the wall surface; aligning one of the plurality of partial areas with the spraying range; fixing the round crucible and spraying the slurry in the spraying range; stopping the spraying; and rotating the round crucible to move another partial area to the spraying range. Then, the steps are repeated until the spraying of all the partial areas is completed.

8 Claims, 5 Drawing Sheets

(51) Int. Cl.
 *C04B 41/87* (2006.01)
 *C30B 35/00* (2006.01)

(56) References Cited

FOREIGN PATENT DOCUMENTS

| | | | |
|---|---|---|---|
| CN | 102221293 | | 5/2013 |
| CN | 206408114 | | 8/2017 |
| CN | 107185790 | | 9/2017 |
| CN | 108341689 | * | 7/2018 |
| CN | 108348943 | | 7/2018 |
| TW | 201033771 | | 9/2010 |
| TW | 201534399 | | 9/2015 |
| TW | I548459 | | 9/2016 |

* cited by examiner

CRUCIBLE STRUCTURE AND METHOD FOR FORMING ISOLATING LAYER OF CRUCIBLE

CROSS-REFERENCE TO RELATED APPLICATION

This application claims the priority benefit of Taiwan application serial no. 108121897, filed on Jun. 24, 2019. The entirety of the above-mentioned patent application is hereby incorporated by reference herein and made a part of this specification.

BACKGROUND OF THE INVENTION

Field of the Invention

The invention relates to a manufacturing technique of a round crucible, and particularly relates to a crucible structure and a method for forming an isolating layer of a crucible.

Description of Related Art

A round crucible is required in the manufacture of a silicon ingot currently needed in the semiconductor or solar industry. The round crucible used today is mostly made of quartz. The quartz material is reacted with molten silicon during the manufacture of the silicon ingot, which damages the round crucible. Therefore, an isolating layer needs to be formed on the inner wall of the round crucible to ensure that the crystal growth of the molten silicon in the round crucible forms a silicon ingot having good quality and to extend the service life of the round crucible.

The current manufacturing method of the isolating layer of a crucible usually includes gradually brushing a slurry on the inner surface of the round crucible with a brush. Moreover, in the brushing method, only a small amount of slurry may be picked up each time to prevent the phenomenon of slurry flow, and in order to ensure the coating layer is smooth, complicated steps are needed. In the process of brushing, abnormalities such as bristles and impurities need to be dealt with instantly.

The isolating layer formed by the brushing method is prone to cracking, thus causing the issue of white spots on the ingot, such that the quality and yield of the silicon ingot may not be improved.

SUMMARY OF THE INVENTION

The invention provides a method for forming an isolating layer of a crucible that may meet the requirements of uniform spraying of the isolating layer and may increase the service life of a round crucible, and improve the quality and yield of a silicon ingot.

The invention also provides a crucible structure that may strengthen and protect the round crucible at a solid-liquid interface, so as to increase the service life of the round crucible.

A method for forming an isolating layer of a crucible of the invention includes the following steps. A round crucible is placed sideways. An inside of the round crucible has a wall surface and a bottom surface, such that the bottom surface of the inside of the round crucible is perpendicular to a horizontal plane. A plurality of spraying processes are performed to form an isolating layer on the bottom surface and the wall surface of the round crucible. Each of the spraying processes includes the following steps: (a) a slurry is sprayed on the bottom surface; (b) an optical positioner is used to set a spraying range the same as one of a plurality of partial areas divided from the wall surface; (c) one of the plurality of partial areas is aligned with the spraying range; (d) the round crucible is fixed and the slurry is sprayed in the spraying range; (e) the spraying is stopped; and (f) the round crucible is rotated to move another partial area to the spraying range. Then, the above steps (d) to (f) are repeated until the spraying of all of the partial areas is completed.

In an embodiment of the invention, a spray gun is used for spraying in step (a) and step (d) during the spraying process, and the spray gun is kept perpendicular to the bottom surface and the wall surface during spraying, respectively.

In an embodiment of the invention, the distance of the spraying is between 20 cm and 30 cm, and the pressure of the spraying is between 60 psi and 80 psi.

In an embodiment of the invention, a method for spraying the slurry on the bottom surface and in the spraying range includes fixing the round crucible and continuously spraying in an S-shaped movement from top to bottom or from close to the bottom surface to an outside.

In an embodiment of the invention, the plurality of partial areas are 4 partial areas, and a positioning point of the optical positioner is at half of a height of the round crucible.

In an embodiment of the invention, the spraying range covers a bottommost portion of the wall surface after the round crucible is placed sideways.

In an embodiment of the invention, a temperature difference between a surface temperature of the wall surface before the spraying process and a surface temperature thereof in step (f) is 7° C. to 10° C.

In an embodiment of the invention, before the plurality of spraying processes, a pre-spraying may be performed on the wall surface in a range of plus or minus 5 cm of a solid-liquid interface, wherein the solid-liquid interface is at an area between 70% and 90% of a height of the round crucible.

Another crucible structure of the invention includes a round wall, a bottom portion, and an isolating layer. The bottom portion is located at an end of the round wall, and the isolating layer is formed on an inner surface of the round wall and an inner surface of the bottom portion, wherein the isolating layer has a thickened area in a range of plus or minus 5 cm of a solid-liquid interface, the solid-liquid interface is a liquid-level position in the crucible structure, and a thickness of the isolating layer in the thickened area is greater than a thickness thereof in other portions.

In another embodiment of the invention, the thickness of the isolating layer in the thickened area is between 0.215 mm and 0.45 mm.

In another embodiment of the invention, the thickness of the isolating layer in the other portions other than the thickened area is between 0.2 mm and 0.4 mm.

In another embodiment of the invention, a ratio of a thickness difference between the thickness of the isolating layer in the thickened area and the thickness thereof in the other portions other than the thickened area to the thickness thereof in the other portions other than the thickened area is between 8% and 12%.

Based on the above, in the invention, specific spraying steps are used to produce a uniform isolating layer to increase the service life of the round crucible, thereby improving the quality and yield of the silicon ingot. In addition, in the invention, the isolating layer in the range of plus or minus 5 cm of the solid-liquid interface may be thickened via pre-spraying. Even if the outer isolating layer is peeled off by the disturbance of the silicon melt, the inner layer thereof may still protect the round crucible to reduce the risk of adhesion of the round crucible.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
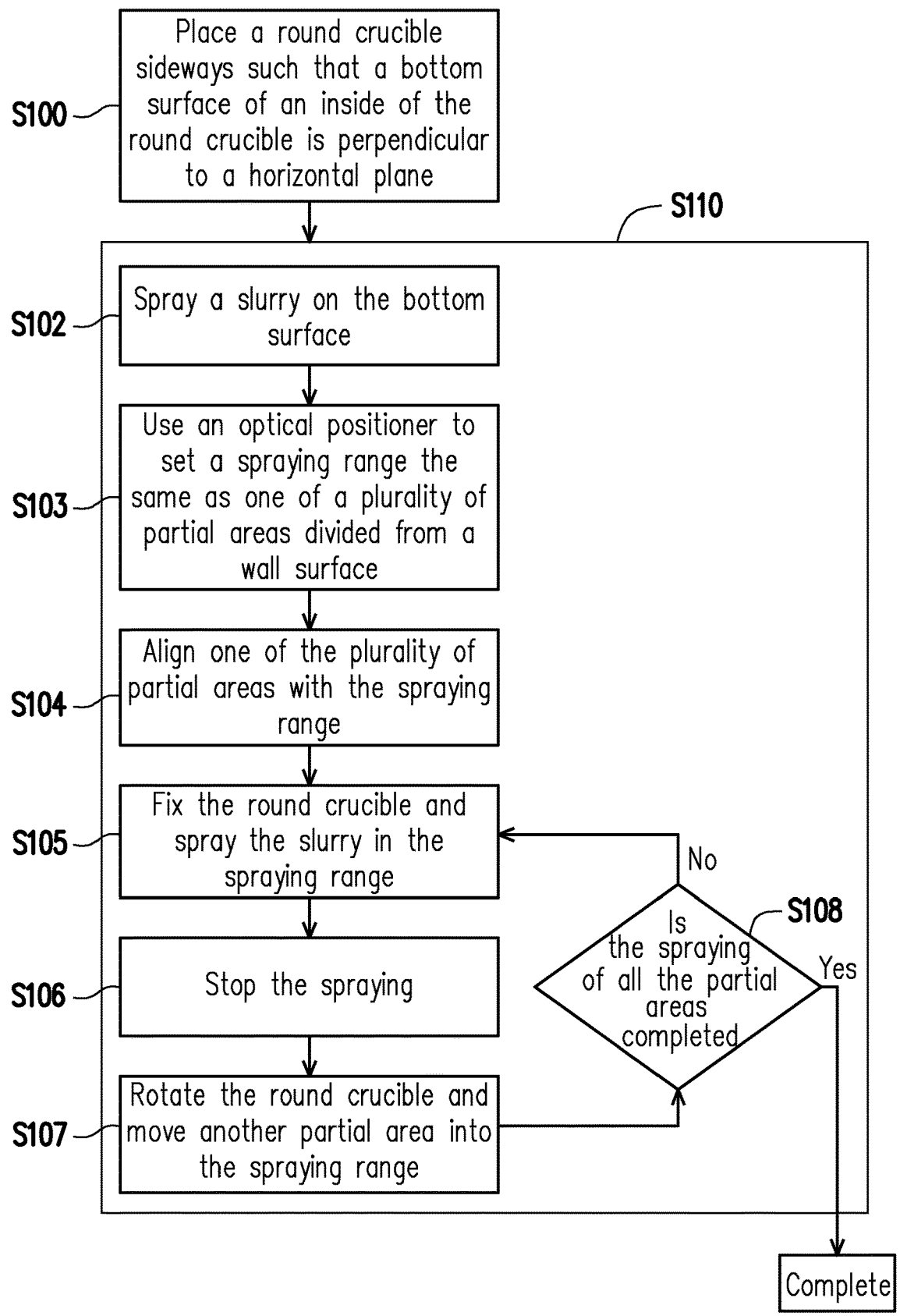
FIG. 1 is a step diagram of forming an isolating layer of a crucible according to an embodiment of the invention.

Some embodiments are provided hereinafter and described in detail with reference to figures. However, the embodiments provided are not intended to limit the scope of the invention. Moreover, the figures are only descriptive and are not drawn to scale. For ease of explanation, the same devices below are provided with the same reference numerals. Moreover, terms such as "contain", "include", and "have" used in the specification are all open terms, i.e., contains, but not limited to. Moreover, directional terms used in the specification such as "up" and "down" are only directions used in the figures. Therefore, the directional terms are used to illustrate and are not intended to limit the invention.

It should be noted that the relevant numbers and shapes mentioned in the corresponding figures in the present embodiment are only used to specifically describe the embodiments of the invention, so as to facilitate the understanding of the contents thereof, rather than limiting the scope of the invention.

FIG. 1 is a step diagram of forming an isolating layer of a crucible according to an embodiment of the invention.

Figure 2:
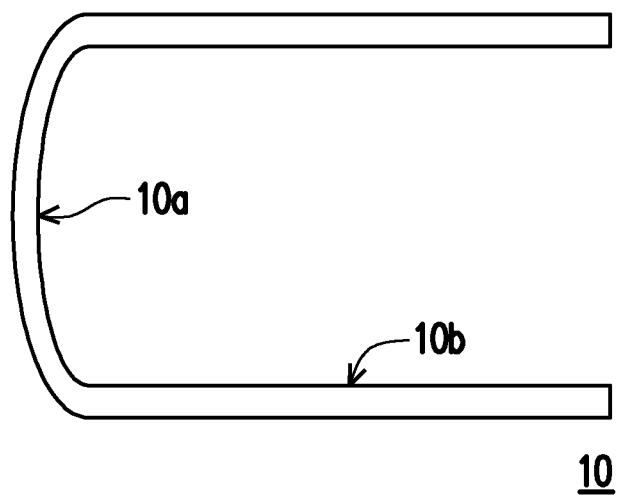
FIG. 2 is a cross-sectional view of the round crucible in step S100 of FIG. 1 placed sideways.

Referring to FIG. 1, in step S100, a round crucible is placed sideways such that a bottom surface of an inside of the round crucible is perpendicular to a horizontal plane, and then a subsequent spraying step is performed as shown in the sideways placement mode shown in FIG. 2. The inside of a round crucible 10 has a bottom surface 10a and a wall surface 10b, and therefore placing the round crucible 10 sideways makes the bottom surface 10a thereof perpendicular to the horizontal plane, wherein the round crucible 10 is, for example, a quartz crucible, but not limited thereto.

Then, a plurality of spraying processes of step S110 are performed to form an isolating layer on the bottom surface and the wall surface of the round crucible. Each step S110 includes the following steps.

Figure 3A:
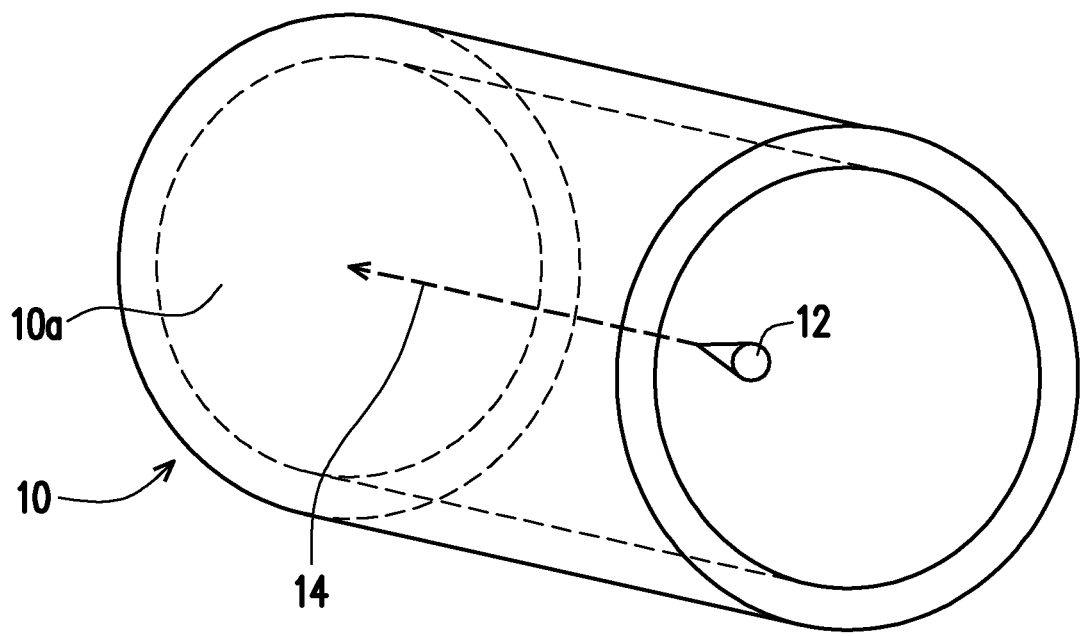
FIG. 3A to FIG. 3B are 3D views of step S102 of FIG. 1.
Figure 3B:
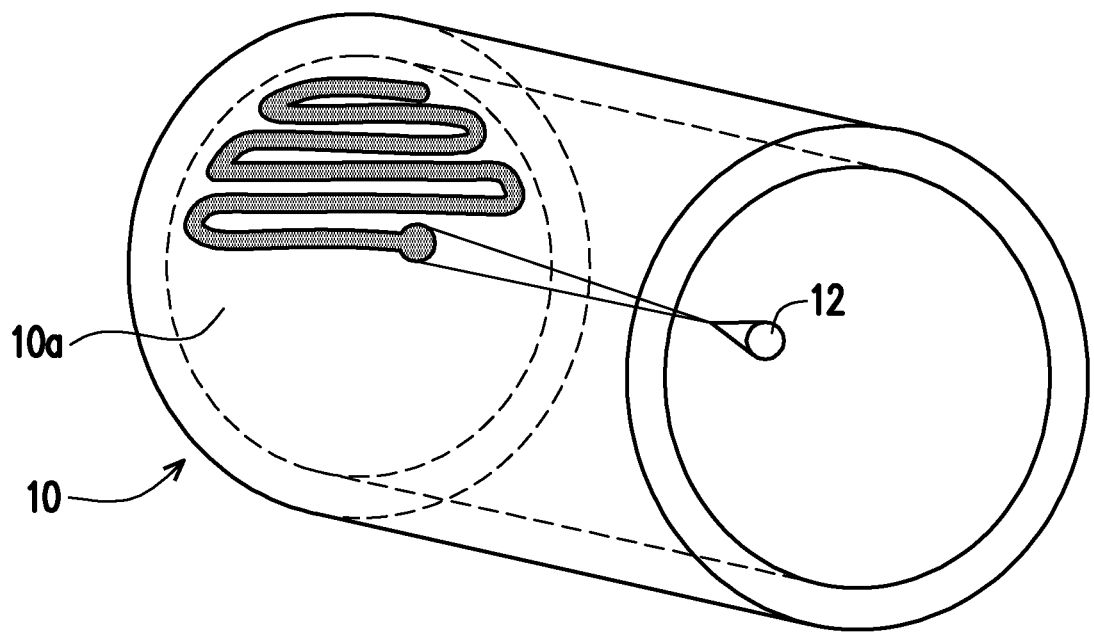

First, in step S102, a slurry is sprayed on the bottom surface. The diagram of step S102 is shown in FIG. 3A to FIG. 3B. First, a spraying device such as a spray gun 12 is used, and the slurry is, for example, formed by water, silicon nitride powder, and polyvinyl alcohol (PVA), but the invention does not limit the type of the slurry used. In FIG. 3A, a spraying direction 14 of the spray gun 12 is perpendicular to the bottom surface 10a of the round crucible 10. FIG. 3B shows that the spray gun 12 continuously sprays the bottom surface 10a in an S-shaped movement from top to bottom. In an embodiment, the distance of the spraying of the spray gun 12 from the bottom surface 10a is, for example, between 20 cm and 30 cm, and the pressure of the spraying of the spray gun 12 is, for example, between 60 psi and 80 psi, but the invention is not limited thereto. The object of FIG. 3B is to clearly illustrate the spraying movement path of the spray gun 12, and FIG. 3 does not entail that the bottom surface 10a of the round crucible 10 has a unsprayed portion after the spraying.

Figure 4:
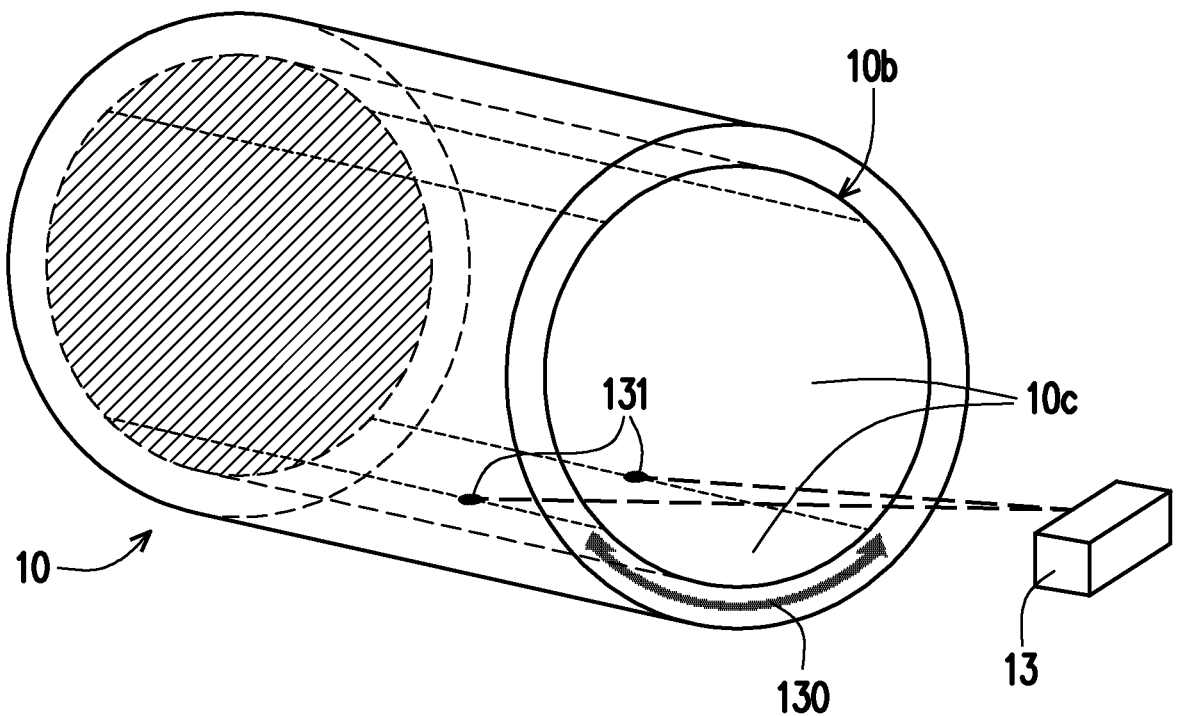
FIG. 4 is a 3D view of steps S103 to S104 of FIG. 1.

After step S102 is completed, step S103 is performed to use an optical positioner to set a spraying range the same as one of a plurality of partial areas divided from the wall surface, as shown in FIG. 4. In FIG. 4, the wall surface 10b of the round crucible 10 is divided into four partial areas 10c. In the present embodiment, the wall surface 10b of the round crucible 10 is equally divided into four partial areas 10c, but the number of the partial areas 10c is not limited thereto, and the size (such as the circumference) of the wall surface 10b may be increased or decreased to increase the uniformity of spraying. Next, the optical positioner 13 is used to position one spraying range 130, and the spraying range 130 is equivalent to the coverage area of one of the partial areas 10c. From the viewpoint of uniform spraying, the round crucible 10 is placed sideways. Therefore, the spraying range 130 covers, for example, the bottommost portion of the wall surface 10b after the round crucible 10 is placed sideways. In this way, the issue of uneven coating of the slurry due to the slurry flowing downward from gravity when the round crucible 10 is sprayed under the traditional upright position may be avoided. Considering the four partial areas 10c, a positioning point 131 of the optical positioner 13 may be at half of a height of the round crucible 10. In the present embodiment, the optical positioner 13 is, for example, a laser positioner, but is not limited thereto.

Next, in step S104, one of the partial areas is aligned with the spraying range, as may also be seen in FIG. 4. The alignment method includes, for example, rotating the round crucible such that one of the partial areas falls between two positioning points 131.

Figure 5:
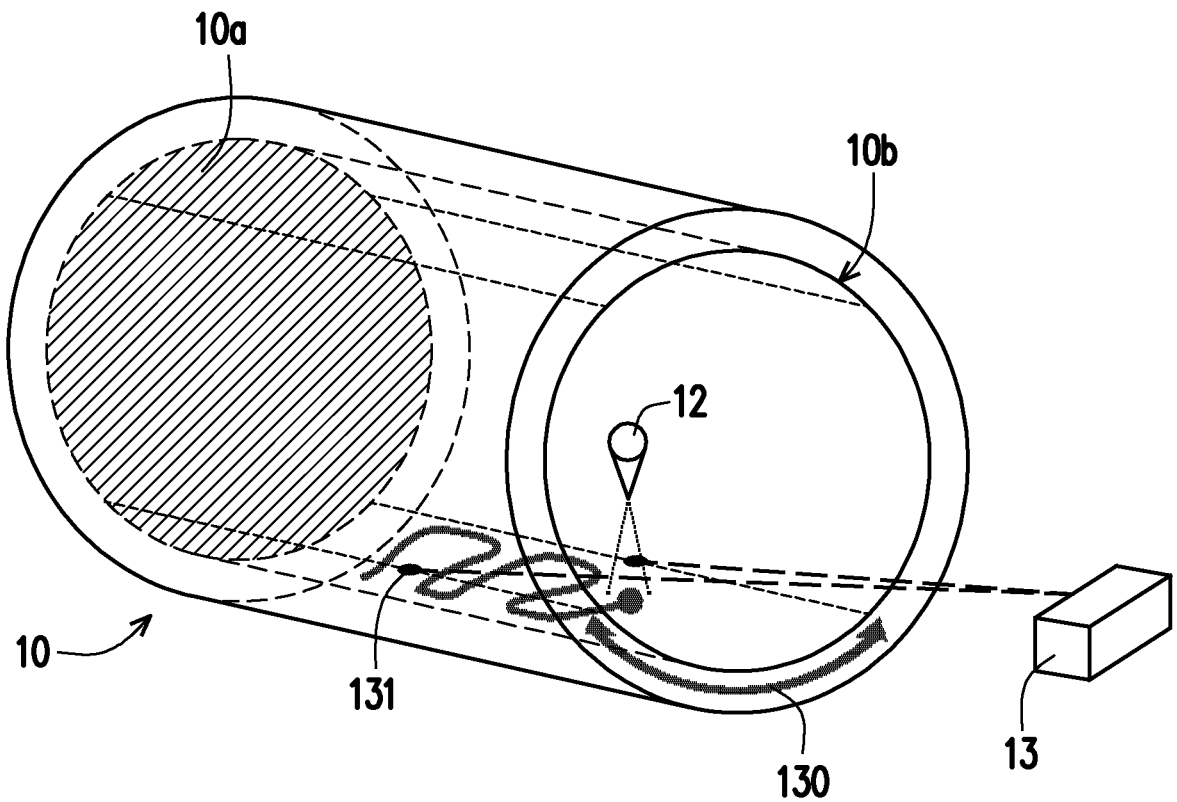
FIG. 5 is a 3D view of step S105 of FIG. 1.

Then, in step S105, the round crucible is fixed and a slurry is sprayed in the spraying range, as shown in FIG. 5. When the spray gun 12 is spraying, the spraying range 130 may be secured by the positioning points 131. In this way, the issue that the slurry line is readily interfered due to the spray gun 12 spraying the entire surface in a traditional continuous circular manner without partitions may be avoided. The slurry of step S105 is the same as that of step S102 and is therefore not repeated herein. The spray gun 12 is, for example, kept perpendicular to the wall surface 10b during spraying, the distance of the spraying is, for example, between 20 cm and 30 cm, and the pressure of the spraying is, for example, between 60 psi and 80 psi, but the invention is not limited thereto. The spraying path of step S105 includes, for example, continuously spraying the entire spraying range 130 in an S-shaped movement from close to the bottom surface 10a toward an outside. The object of FIG. 5 is to clearly illustrate the spraying movement path of the spray gun 12, and FIG. 3 does not entail that the wall surface 10b of the round crucible 10 has a unsprayed portion after the spraying.

After step S105 is completed, step S106 is performed to stop the spraying.

Figure 6:
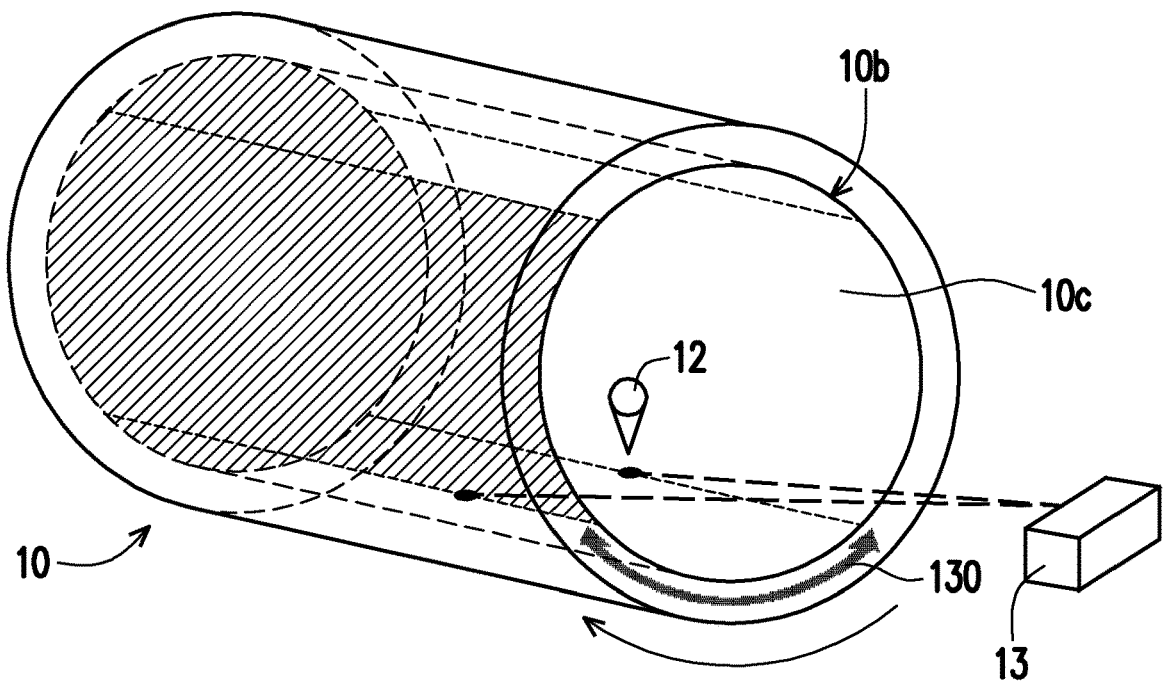
FIG. 6 is a 3D view of step S107 of FIG. 1.

Then, step S107 is performed to rotate the round crucible and move another partial area into the spraying range, as shown in FIG. 6. In an embodiment, the round crucible 10 is rotated clockwise by an angle of 90 degrees, and an unsprayed partial area 10c is moved into the spraying range 130. In another embodiment, the round crucible 10 may also be rotated counterclockwise, and is not limited thereto. From the viewpoint of reducing impurities, the temperature difference between the surface temperature of the wall surface 10b before step S105 is performed and the surface temperature thereof in step S107 is, for example, less than 10° C., that is, the temperature difference before and after the spraying is 6° C. to 12° C., preferably 7° C. to 10° C.

Then, in step S108, whether the spraying of all the partial areas is completed is determined. If not, step S105 to step S107 are repeated until the spraying of all the partial areas is completed. In addition, after the spraying processes (step S110), a baking step (not shown) may also be performed.

Although FIG. 1 shows only one step S110, a plurality of steps S110 need to be repeated to achieve the desired thickness. For example, the spraying processes of the present embodiment are two or more, such as 9 to 11 spraying processes.

In addition, since the round crucible 10 of FIG. 2 is readily deformed at a solid-liquid interface disturbed by silicon melt under a high-temperature growth process, pre-spraying may be performed in a range of plus or minus 5 cm of the solid-liquid interface, wherein the "solid-liquid interface" is the liquid-level position of the silicon melt during the crystal growth of the round crucible, and is generally at an area between about 70% to 90% of the height of the round crucible 10. The pre-spraying process is the same as step S103 to step S107, but the spraying range is only in the range of plus or minus 5 cm of the solid-liquid interface. Due to the thickening of the isolating layer at the solid-liquid interface, even if the outer isolating layer is peeled off by the disturbance of the silicon melt, the inner layer thereof may still protect the round crucible and reduce the risk of adhesion of the round crucible. The film thickness formed by the pre-spraying is, for example, between 0.015 mm and 0.05 mm, and then the spraying processes are performed (step S110).

Figure 7:
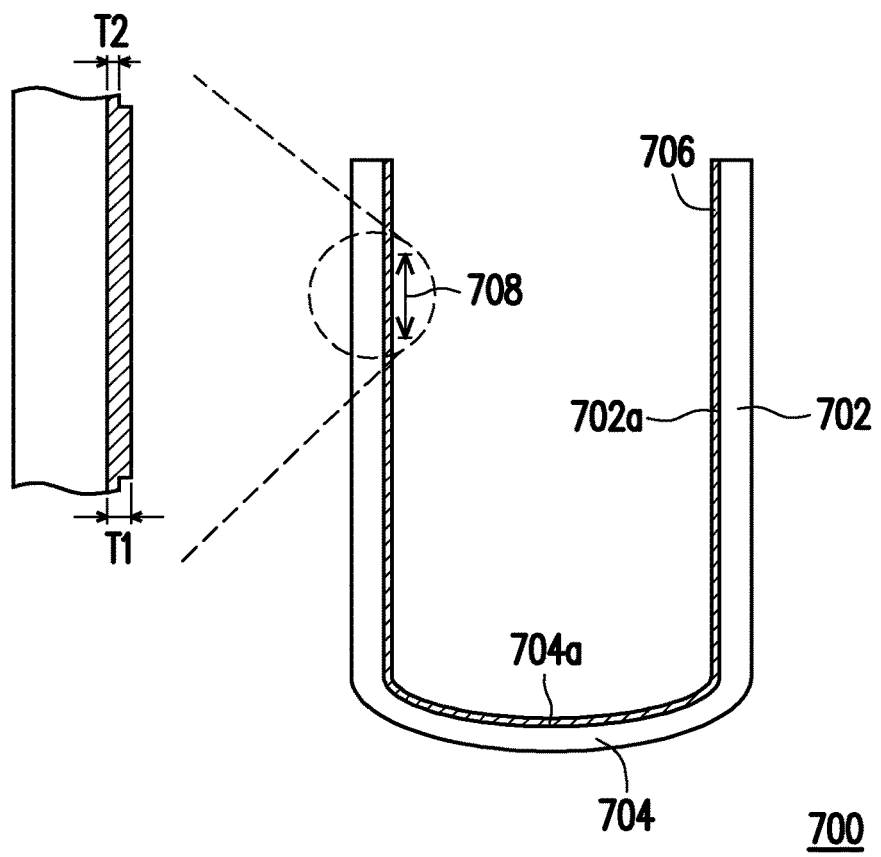
FIG. 7 is a cross-sectional view of a crucible structure according to another embodiment of the invention.

FIG. 7 is a cross-sectional view of a crucible structure according to another embodiment of the invention.

Referring to FIG. 7, a crucible structure 700 of the present embodiment includes a round wall 702, a bottom portion 704, and an isolating layer 706. The bottom portion 704 is located at an end of the round wall 702, the isolating layer 706 is formed on an inner surface 702a of the round wall 702 and an inner surface 704a of the bottom portion 704, the isolating layer 706 has a thickened area 708 in a range of plus or minus 5 cm of a solid-liquid interface, and the solid-liquid interface is the liquid-level position in the crucible structure 700, and is generally at an area between about 70% and 90% of the height of the crucible structure 700. A thickness T1 of the isolating layer 706 in the thickened area 708 is greater than a thickness T2 thereof in other portions. In an embodiment, the thickness T1 of the isolating layer 706 in the thickened area 708 is, for example, between 0.215 mm and 0.45 mm, and the thickness T2 of the isolating layer 706 in the other portions other than the thickened area 708 is, for example, between 0.2 mm to 0.4 mm. In another embodiment, the ratio of the thickness difference between the thickness T1 of the isolating layer 706 in the thickened area 708 and the thickness T2 thereof in the other portions other than the thickened area 708 to the thickness T2 is between 8% and 12%, and the ratio of "8% to 12%" is based on an overlap of about 50% of each spray. Therefore, each spraying process has a thickness of two sprays, and the 9 to 11 spraying processes have a thickness of 18 to 22 sprays. Therefore, strengthening the solid-liquid interface twice is equivalent to ($2/22=$)9.1% to ($2/18=$)11.1%, between about 8% and 12%. Such a crucible structure 700 may reduce the risk of adhesion of the round wall 702 at the solid-liquid interface during high-temperature crystal growth in the case of disturbance by the silicon melt.

Below, one experiment is provided to verify the efficacy of the embodiments of the invention, but the scope of the invention is not limited to the following.

Experimental Example 1

First, a slurry was prepared, wherein the ratio of water:silicon nitride powder:polyvinyl alcohol was 3.5:1:0.03. The forming steps of the isolating layer of the crucible of FIG. 1 were performed, and a total of 9 spraying processes were performed (step S110). The spraying time of each spraying process was between 3 minutes and 5 minutes. The temperature difference before and after the spraying was controlled between 7° C. and 10° C., and the surface temperature of the round crucible before the spraying was greater than 70° C. The powder weight per unit area of each spraying process was calculated to be between 0.025 g/cm$^2$ and 0.031 g/cm$^2$, and "powder weight per unit area" refers to a value obtained by dividing the powder weight (g) in a batch of slurry by the total area (cm$^2$) after the entire batch of slurry was sprayed. After 9 spraying processes were completed (step S110), the total thickness was measured to be 0.2 mm to 0.4 mm.

Comparative Example

The slurry of the Experimental example was brushed on an inner surface of a round crucible using a brush. The amount of each slurry dipping needed to be small, and the phenomenon of slurry flow needed to be avoided when brushing on the round crucible. The slurry needed to be brushed dry each time before the next layer was brushed. Brushing was performed starting from the mouth of the round crucible and gradually toward the bottom portion. Each layer of slurry needed to be brushed dry. The slurry needed to be brushed horizontally, and was brushed longitudinally to be brushed dry. The above brushing was repeated until the thickness of the isolating layer reached 0.2 mm to 0.4 mm. Visually, the ingot surface had large areas of white spots, and the incidence of crucible adhesion due to the peeling of the isolating layer during the crystal growth process was about 20%.

Comparison

The same high-temperature crystal growth process was performed respectively using the crucible structures of the Experimental example and the Comparative example. A direct visual inspection of the resulting ingots revealed that the surface of the ingot formed by the crucible structure of the Comparative example had large areas of white spots, and the surface of the ingot formed by the isolating layer of the crucible structure of the Experimental example did not have the issue of white spots, and the incidence of crucible adhesion due to the peeling of the isolating layer during the crystal growth process was reduced to about 5%.

Experimental Example 2

One more pre-spraying process was added to the thickened area (such as 708 of FIG. 7) at an area between 70% and 90% of the height of the wall surface in the round crucible (that is, a range of plus or minus 5 cm of the solid-liquid interface) (step S103 to step S107). After the same 9 spraying processes as in Experimental example 1 were completed, the total thickness of the thickened area was additionally measured to obtain a value of 0.215 mm to 0.45 mm.

The surface of the ingot formed by the isolating layer of the crucible structure of Experimental example 2 did not have the issue of white spots, and the incidence of crucible adhesion due to the peeling of the isolating layer during the crystal growth process was reduced to about <1%.

Based on the above, in the invention, a specific spraying method and a positioning system are used in conjunction to avoid the phenomenon of uneven thickness of the isolating layer coating inside the round crucible and to achieve uniform spraying. In addition, in the invention, pre-spraying is performed in an area of plus or minus 5 cm of the solid-liquid interface position on the round wall of the isolating layer of the round crucible to increase the thickness of the isolating layer at the position of the solid-liquid interface. When the outer layer of the isolating layer of the thickened area is peeled off, there is still an inner layer of the isolating layer to protect the round crucible. Such a crucible structure may have a longer service life and improve the quality and yield of silicon ingots.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method for foiniing an isolating layer of a crucible, comprising:
    placing a round crucible sideways such that a bottom surface of an inside of the round crucible is perpendicular to a horizontal plane, and the inside of the round crucible has a wall surface and the bottom surface; and
    perfoiiiiing a plurality of spraying processes to form the isolating layer on the bottom surface and the wall surface, wherein each of the spraying processes comprises:
    (a) spraying a slurry on the bottom surface;
    (b) using an optical positioner to set a spraying range the same as one of a plurality of partial areas divided from the wall surface;
    (c) aligning one of the plurality of partial areas with the spraying range;
    (d) fixing the round crucible and spraying the slurry in the spraying range;
    (e) stopping the spraying;
    (f) rotating the round crucible to move another partial area to the spraying range; and
    (g) repeating steps (d) to (f) until the spraying of all of the partial areas is completed.

2. The method for forming the isolating layer of the crucible of claim 1, wherein in the spraying process, a spray gun is used to perform the spraying of steps (a) and (d), and the spray gun is kept perpendicular to the bottom surface and the wall surface during the spraying, respectively.

3. The method for forming the isolating layer of the crucible of claim 2, wherein a distance of the spraying is between 20 cm and 30 cm, and a pressure of the spraying is between 60 psi and 80 psi.

4. The method for fol. ning the isolating layer of the crucible of claim 1, wherein a method of spraying the slurry on the bottom surface and in the spraying range comprises fixing the round crucible and continuously spraying in an S-shaped movement from top to bottom or from close to the bottom surface toward an outside.

5. The method for forming the isolating layer of the crucible of claim 1, wherein the plurality of partial areas are 4 partial areas, and a positioning point of the optical positioner is at half of a height of the round crucible.

6. The method for forming the isolating layer of the crucible of claim 1, wherein the spraying range covers a bottommost portion of the wall surface after the round crucible is placed sideways.

7. The method for forming the isolating layer of the crucible of claim 1, wherein a temperature difference between a surface temperature of the wall surface before the spraying process and a surface temperature thereof in step (f) is 7° C. to 10° C.

8. The method for forming the isolating layer of the crucible of claim 1, further comprising, before the plurality of spraying processes, performing a pre-spraying on the wall surface in a range of plus or minus 5 cm of a solid-liquid interface, wherein the solid-liquid interface is at an area between 70% and 90% of a height of the round crucible.

* * * * *